(12) United States Patent
Cok

(10) Patent No.: US 10,622,700 B2
(45) Date of Patent: Apr. 14, 2020

(54) ANTENNA WITH MICRO-TRANSFER-PRINTED CIRCUIT ELEMENT

(71) Applicant: X-Celeprint Limited, Cork (IE)

(72) Inventor: Ronald S. Cok, Rochester, NY (US)

( * ) Notice: Subject to any disclaimer, the term of this patent is extended or adjusted under 35 U.S.C. 154(b) by 84 days.

(21) Appl. No.: 15/596,982

(22) Filed: May 16, 2017

(65) Prior Publication Data

US 2017/0338542 A1 Nov. 23, 2017

Related U.S. Application Data

(60) Provisional application No. 62/338,265, filed on May 18, 2016.

(51) Int. Cl.
 H01Q 1/22 (2006.01)
 G06K 7/10 (2006.01)
 G06K 19/077 (2006.01)
 H01L 23/498 (2006.01)
 H01Q 9/27 (2006.01)

(52) U.S. Cl.
 CPC ....... *H01Q 1/2225* (2013.01); *G06K 7/10366* (2013.01); *G06K 19/077* (2013.01); *G06K 19/07775* (2013.01); *H01L 23/49855* (2013.01); *H01L 2223/6677* (2013.01); *H01Q 9/27* (2013.01)

(58) Field of Classification Search
 CPC ........ H01L 2223/667; H01L 23/49855; H01Q 1/2225; H01Q 9/27
 See application file for complete search history.

(56) References Cited

U.S. PATENT DOCUMENTS

| 5,621,555 | A | 4/1997 | Park |
| 5,815,303 | A | 9/1998 | Berlin |
| 6,142,358 | A | 11/2000 | Cohn et al. |
| 6,278,242 | B1 | 8/2001 | Cok et al. |
| 6,326,261 | B1 | 12/2001 | Tsang et al. |
| 6,577,367 | B2 | 6/2003 | Kim |
| 6,677,186 | B1 * | 1/2004 | Zafrany ........... G06K 19/07749 257/679 |
| 6,717,560 | B2 | 4/2004 | Cok et al. |

(Continued)

FOREIGN PATENT DOCUMENTS

| WO | WO-2008/103931 A2 | 8/2008 |
| WO | WO-2010/132552 A1 | 11/2010 |
| WO | WO-2015/193433 A2 | 12/2015 |

OTHER PUBLICATIONS

Hamer et al., 63.2: AMOLED Displays Using Transfer-Printed Integrated Circuits, SID 09 Digest, 40(2):947-950 (2009).

(Continued)

*Primary Examiner* — Zandra V Smith
*Assistant Examiner* — John M Parker
(74) *Attorney, Agent, or Firm* — William R. Haulbrook; Michael D. Schmitt; Choate, Hall & Stewart LLP

(57) ABSTRACT

An electromagnetic communication device includes a device substrate, an antenna formed on or in the device substrate, and a circuit element having an electrical circuit and one or more electrically conductive connection posts protruding from the circuit element. Each of the connection posts is electrically connected to the electrical circuit and at least one connection post is electrically connected to the antenna.

20 Claims, 8 Drawing Sheets

(56) References Cited

U.S. PATENT DOCUMENTS

| | | |
|---|---|---|
| 6,756,576 B1 | 6/2004 | McElroy et al. |
| 6,822,616 B2 | 11/2004 | Durham et al. |
| 6,933,532 B2 | 8/2005 | Arnold et al. |
| 6,957,481 B1* | 10/2005 | Patrice ............ G06K 19/07749 257/679 |
| 7,050,291 B2 | 5/2006 | Narendra et al. |
| 7,129,457 B2 | 10/2006 | McElroy et al. |
| 7,195,733 B2 | 3/2007 | Rogers et al. |
| 7,288,753 B2 | 10/2007 | Cok |
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,578,053 B2* | 8/2009 | Nishigawa ....... G06K 19/07718 156/285 |
| 7,586,497 B2 | 9/2009 | Boroson et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,893,612 B2 | 2/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,261,660 B2 | 9/2012 | Menard |
| 8,333,860 B1 | 12/2012 | Bibl et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,502,192 B2 | 8/2013 | Kwak et al. |
| 8,506,867 B2 | 8/2013 | Menard |
| 8,558,243 B2 | 10/2013 | Bibl et al. |
| 8,664,699 B2 | 3/2014 | Nuzzo et al. |
| 8,686,447 B2 | 4/2014 | Tomoda et al. |
| 8,689,428 B2* | 4/2014 | Bashan ............ G06K 19/07745 235/492 |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,854,294 B2 | 10/2014 | Sakariya |
| 8,865,489 B2 | 10/2014 | Rogers et al. |
| 8,877,648 B2 | 11/2014 | Bower et al. |
| 8,889,485 B2 | 11/2014 | Bower |
| 8,895,406 B2 | 11/2014 | Rogers et al. |
| 8,934,259 B2 | 1/2015 | Bower et al. |
| 8,941,215 B2 | 1/2015 | Hu et al. |
| 8,987,765 B2 | 3/2015 | Bibl et al. |
| 9,049,797 B2 | 6/2015 | Menard et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,355,854 B2 | 5/2016 | Meitl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 10,050,351 B2 | 8/2018 | Bower et al. |
| 2002/0021248 A1* | 2/2002 | Ying ...................... H01Q 1/243 343/700 MS |
| 2003/0117369 A1 | 6/2003 | Spitzer et al. |
| 2003/0141570 A1 | 7/2003 | Chen et al. |
| 2004/0196190 A1* | 10/2004 | Mendolia ............... H01Q 1/085 343/700 MS |
| 2004/0233109 A1* | 11/2004 | Ying ..................... H01Q 1/243 343/700 MS |
| 2006/0006496 A1 | 1/2006 | Harris et al. |
| 2007/0085202 A1 | 4/2007 | Shionoiri |
| 2010/0248484 A1 | 9/2010 | Bower et al. |
| 2010/0306993 A1 | 12/2010 | Mayyas et al. |
| 2010/0309061 A1 | 12/2010 | Sinha |
| 2011/0291233 A1 | 12/2011 | Gaynor et al. |
| 2012/0228669 A1 | 9/2012 | Bower et al. |
| 2012/0249394 A1 | 10/2012 | Rofougaran et al. |
| 2012/0257324 A1 | 10/2012 | Ma et al. |
| 2012/0313241 A1 | 12/2012 | Bower |
| 2012/0314388 A1 | 12/2012 | Bower et al. |
| 2013/0050055 A1 | 2/2013 | Paradiso et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2013/0309792 A1 | 11/2013 | Tischler et al. |
| 2013/0316487 A1 | 11/2013 | de Graff et al. |
| 2014/0104243 A1 | 4/2014 | Sakariya et al. |
| 2014/0159043 A1 | 6/2014 | Sakariya et al. |
| 2014/0264763 A1 | 9/2014 | Meitl et al. |
| 2014/0267683 A1 | 9/2014 | Bibl et al. |
| 2014/0367633 A1 | 12/2014 | Bibl et al. |
| 2015/0028362 A1 | 1/2015 | Chan et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0372393 A1 | 12/2015 | Bower et al. |
| 2016/0093600 A1 | 3/2016 | Bower et al. |
| 2017/0141115 A1 | 5/2017 | Bower et al. |
| 2017/0206845 A1 | 7/2017 | Sakariya et al. |
| 2017/0302336 A1* | 10/2017 | Rotzoll ................... G07D 7/12 |
| 2017/0338374 A1 | 11/2017 | Zou et al. |

OTHER PUBLICATIONS

Partial International Search Report, PCT/EP2015/063708, dated Oct. 15, 2015.

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

(56) References Cited

OTHER PUBLICATIONS

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

\* cited by examiner

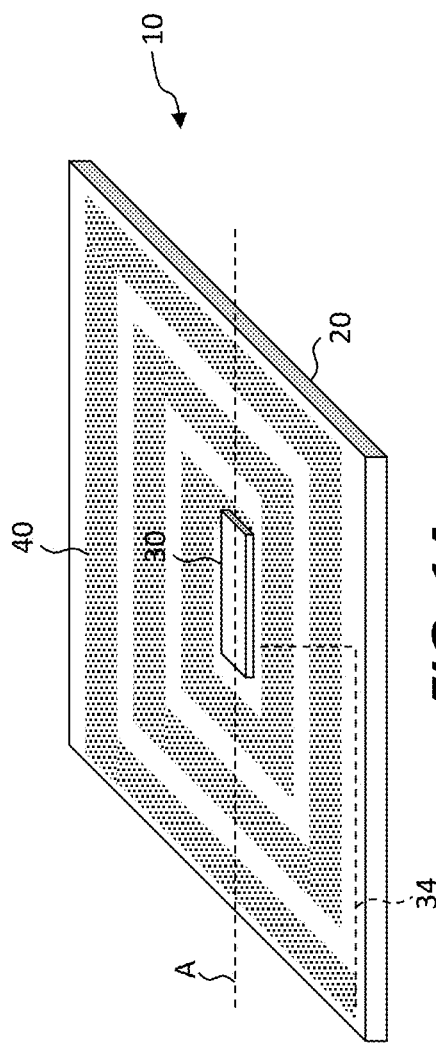
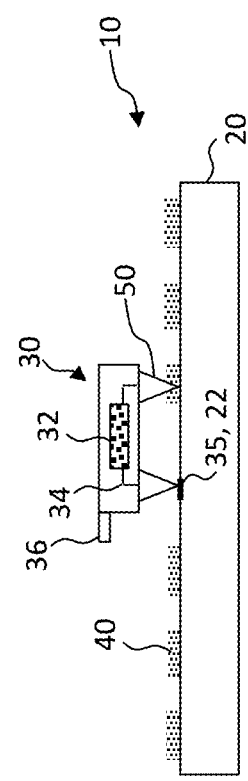
FIG. 1A
FIG. 1B

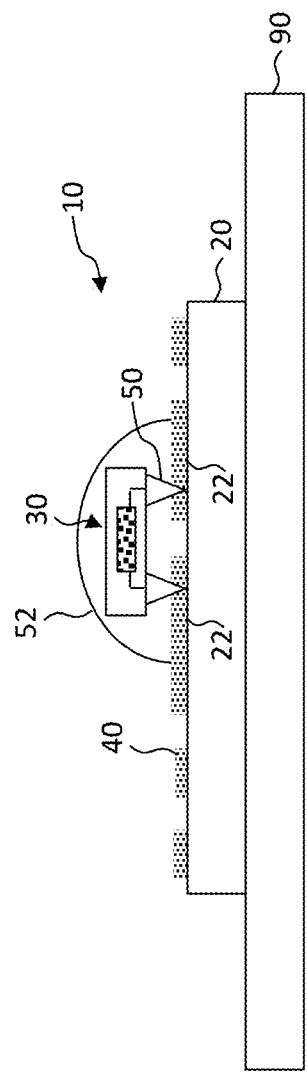
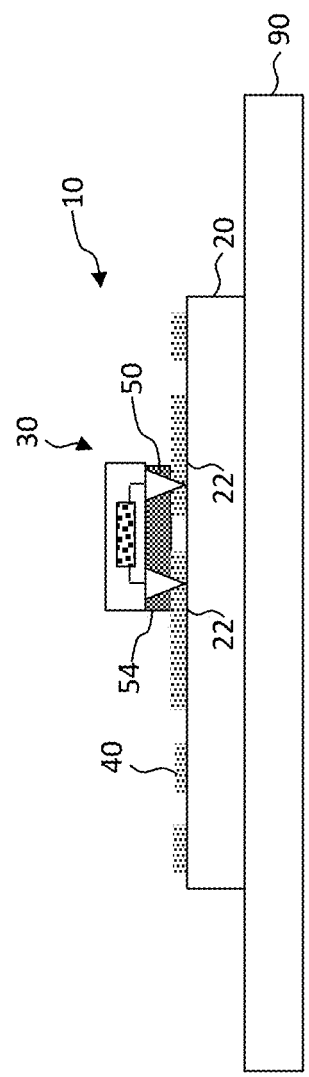

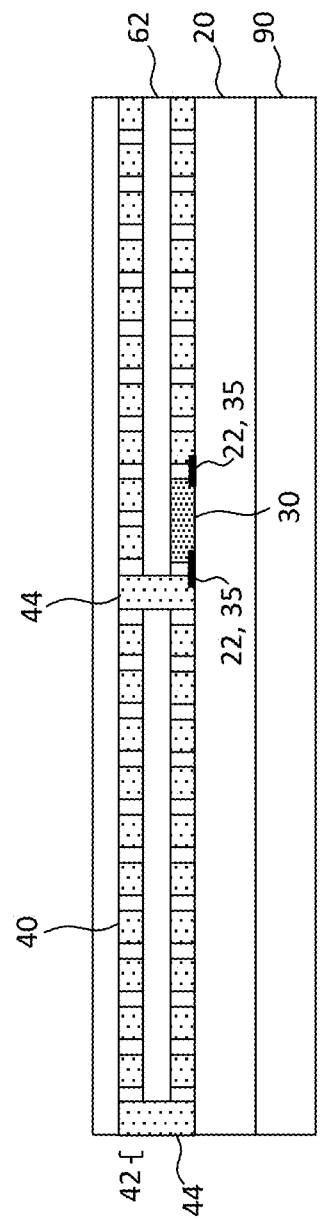

ANTENNA WITH MICRO-TRANSFER-PRINTED CIRCUIT ELEMENT

PRIORITY APPLICATION

This application claims priority to and benefit of U.S. Patent Application No. 62/338,265, filed May 18, 2016, entitled Antenna with Micro-Transfer-Printed Circuit Element, the content of which is hereby incorporated by reference in its entirety.

CROSS REFERENCE TO RELATED APPLICATION

Reference is made to U.S. Pat. No. 8,889,485, entitled Methods for Surface Attachment of Flipped Active Components by Christopher Bower, the disclosure of which is incorporated herein by reference in its entirety.

FIELD OF THE INVENTION

The present invention relates to structures and methods for electrically interconnecting electrical circuit elements to antennas on device substrates using micro-transfer printing.

BACKGROUND OF THE INVENTION

Radio-frequency identification (RFID) devices are attached to products or packaging to provide information about the products. RFID devices typically include a device substrate with an antenna and an integrated circuit disposed on the device substrate. An external RFID communication system provides an RFID signal that is received by the antenna of the RFID device. The received signal provides information and electrical power to the integrated circuit, which then responds with an electromagnetic response signal that is received by the RFID communication system. The response signal provides information about the product or package to which the RFID is attached.

Near-field-communications (NFC) systems also provide an electronic response to electromagnetic stimulation for enabling financial transactions by employing a set of electromagnetic communication protocols that enable two electronic devices, one of which is usually a portable device such as a smartphone, to communicate by bringing them within 4 cm of each other. These devices use electromagnetic induction between two loop antennae to communicate and transmit power, for example as disclosed in U.S. Pat. No. 7,688,270. Thus, at least one of the devices can operate without a stored energy device such as a battery.

Electromagnetically stimulated communication devices are typically made by printing, stamping, or laminating an antenna onto a provided communication device substrate and then affixing an integrated circuit to the provided communication device substrate. The integrated circuit is encapsulated in a plastic or ceramic package with connection pins and electrically connected to the antenna using wires formed on the device substrate using photolithographic, surface mount, or soldering methods. The integrated circuit can be a surface mount device and is disposed on the device substrate using methods such as pick-and-place. At present, the smallest device that can be disposed using conventional methods has a width or length of at least 200 microns. Thus, such communication devices are relatively large and readily visible to an observer. The communication device substrate is then affixed to a package or label that is applied to or encloses an object.

An alternative method for transferring active components from one substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such methods it is generally necessary to electrically connect the small integrated circuits or chiplets to electrically conductive elements such as contact pads on the destination substrate. By applying electrical signals to conductors on the destination substrate, the small integrated circuits are energized and made operational. The electrical connections between the small integrated circuits and the contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the contact pads on the destination substrate. Additional layers, such as interlayer dielectric insulators can also be required. This process is expensive and requires a number of manufacturing steps. Moreover, the topographical structure of the small integrated circuits over the destination substrate renders the electrical connections problematic. For example, it can be difficult to form a continuous conductor from the destination substrate to the small integrated circuit because of the differences in height over the surface between the small integrated circuits and the destination substrate.

Electromagnetically stimulated communication devices are widely used in cost-sensitive applications, such as tracking, financial transactions, and anti-counterfeiting. It is desirable to make these communication devices small to reduce their costs and make them available on a wide variety of substrates, for example flexible substrates. In some applications it is useful to render the communication devices difficult to perceive by the human visual system. There is a need, therefore, for an efficient, effective, and low-cost method of manufacturing such communication devices that reduces both the size of the communication devices and their cost.

SUMMARY OF THE INVENTION

In embodiments of the present invention, an electromagnetic communication device includes a device substrate and an antenna formed on or in the device substrate. A circuit element has an electrical circuit and one or more electrically conductive connection posts protruding from the circuit element or from a surface of the circuit element. Each of the connection posts electrically connects to the electrical circuit and at least one connection post electrically connects to the antenna. The circuit element can be or include a micro-transfer printed electrical component, integrated circuit, or chiplet having a fractured tether. The device substrate can be a label or security document such as a government-issued identification document or banknotes, or commercial certificates, bonds, or the like.

The antenna can be spiral antenna, a loop antenna, or a multi-layer spiral loop antenna having first and second ends and an even number of layers. Both of the first and second ends of the antenna can be closer to the center of the spiral than to the outside edge of the spiral, thereby reducing the number of layers, vias, and connections required to electrically connect the antenna to the circuit element. In some embodiments, the antenna is a loop antenna and the circuit element has at least first and second connection posts. The first connection post is electrically connected to the first end of the loop antenna and the second connection post is electrically connected to the second end of the loop antenna.

A method of making an electromagnetic communication device includes providing a device substrate having an antenna formed on or in the device substrate, providing a circuit element having an electrical circuit and one or more electrically conductive connection posts protruding from the circuit element. Each of the connection posts is electrically connected to the electrical circuit and at least one connection post is electrically connected to the antenna. In further embodiments, a source wafer including one or more micro-transfer printable chiplets is provided and one or more micro-transfer printable chiplets are micro-transfer printed from the source wafer onto the device substrate. At least one connection post is in contact with the antenna and can be embedded in the antenna, pierces the surface of the antenna, pierces the antenna, or is deformed.

In alternative embodiments, the one or more micro-transfer printable chiplets are micro-transfer printed from the source wafer to an intermediate substrate. The intermediate substrate has forms for connection posts, and the connection posts are constructed and the chiplets are electrically connected to the connection posts to make the circuit element. The circuit elements are then micro-transfer printed from the intermediate substrate to the device substrate. In some embodiments, the intermediate substrate includes a plurality of circuit elements and the intermediate substrate has an area that is equal to or larger than the area of the device substrate.

In accordance with embodiments of the present invention, circuit elements including an electrically conducting connection post protruding from a side of the circuit element are formed in a source wafer over a sacrificial portion and attached to the source wafer with a tether. A transfer stamp is pressed against the circuit element to fracture the tether and adhere the circuit element to the transfer stamp. Using the transfer stamp, the circuit elements are brought into contact with a contact pad on a destination substrate such as the device substrate to form an electrical connection between the circuit element and the contact pad. The circuit elements can be at least partially adhered to the device substrate by forcefully driving the connection posts into the contact pads when micro transfer printing, for example by exerting mechanical pressure on the transfer stamp. The connection posts, the contact pads, or both the connection posts and contact pads can be deformed or crumpled and the connection post can be driven into or through the contact pad, thereby wedging the connection post into the contact pad to adhere the connection post to the contact pad and form an electrical contact between them. As a consequence, the connection post can be welded to the contact pad. An additional heat treatment can be provided to facilitate the welding. Alternatively or additionally, a layer of metal, for example a solder can be provided on either the surface of the connection post or the contact pad, or both, that can be heated, causing the solder to reflow and thereby both adhere and electrically connect the connection post to the contact pad. Moreover, an adhesive can be provided on the device substrate or circuit element to adhere the circuit element to the device substrate. The adhesive can be patterned, can be located between the circuit element and the device substrate, can underfill the volume between the circuit element and the device substrate, or can shrink when cured to further adhere the circuit element to the device substrate. The adhesive can cover the contact pad and the connection post can extend through the adhesive.

In accordance with embodiments of the present invention, integrated circuit components such as chiplets or circuit elements incorporating active elements such as transistors, diodes, or light-emitting diodes and passive elements such as resistors, capacitors, and conductors are micro transfer printed from a native source wafer to a non-native destination substrate, device substrate, backplane, or intermediate wafer. In other embodiments, circuit elements are micro-transfer printed from an intermediate wafer to a destination substrate such as the device substrate.

In certain embodiments, a micro-transfer printable component wafer includes a wafer comprising a wafer material, a patterned sacrificial layer forming sacrificial portions spaced apart by anchor portions formed on or in the wafer, and a plurality of components each formed, located, or disposed entirely over a sacrificial portion and connected to an anchor by a tether in a patterned sacrificial layer. The sacrificial portions can comprise an etchable material other than the wafer material, the sacrificial portions can comprise an anisotropically etchable portion of the wafer material, or the sacrificial portions can comprise a gap between the component and the wafer material, for example made by etching the material.

In certain embodiments, a method of making a micro-transfer printable component wafer includes providing a wafer comprising a wafer material, forming a patterned sacrificial layer having sacrificial portions spaced apart by anchor portions formed on or in the wafer, and providing a plurality of components, where each component is disposed entirely over a sacrificial portion and connected to an anchor by a tether. In some embodiments, the components are micro-transfer printed on or over the sacrificial portions. In some embodiments, the components are formed on or over the sacrificial portions. One or more connection post forms can be made in each sacrificial portion and electrodes can be formed in the connection post forms and electrically connected to the components to make one or more connection posts. The sacrificial portions can be etched to form a tether connecting the component to the anchor and form a gap between the components and the wafer material.

Because the components can be made using integrated circuit photolithographic techniques having a relatively high resolution and cost and the destination substrate, for example a flexible paper device substrate, can be patterned using techniques such as screen printing or lamination methods having a relatively low resolution and cost, the contact pads on the device substrate can be much larger than the connection posts or electrical contacts on the component, facilitating the use of multiple connection posts with a common contact pads, reducing electrical faults, and reducing manufacturing costs. Moreover, the electrical circuit in the circuit element can be made using widely available integrated circuit processing methods and materials providing high performance compared to circuits or elements made on a flexible substrate, for example using organic materials and solution processing, while the larger antenna can be made using lower cost and lower resolution methods.

In certain embodiments, the micro-transfer printable component has at least one of a width, length, and height from 2 to 5 µm, 5 to 10 µm, 10 to 20 µm, or 20 to 50 µm. In certain embodiments, the device substrate is flexible, for example paper, plastic, polymer, PEN, PET, metal, metal foil, or flexible glass. The intermediate substrate can be a member selected from the group consisting of polymer, plastic, resin, polyimide, PEN, PET, metal, metal foil, glass, a semiconductor, and sapphire. In certain embodiments, the device substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, two or more contact pads comprise a material that is softer than that of the connection post. In certain embodiments, the connection posts comprise a material that is softer than that of the two or more contact pads. In certain embodiments, a conductive material other than a material of the contact pad or the connection post adheres or electrically connects (e.g., or both) the contact pad to the connection post. In certain embodiments, the contact pad has a first conductive layer and a second conductive layer over the first conductive layer, and the second conductive layer has a lower melting temperature than the first conductive layer, wherein the backplane contact pad is coated with a non-conductive layer, or wherein the backplane contact pad is formed on a compliant non-conductive layer. In certain embodiments, the second conductive layer is a solder. In certain embodiments, the contact pad is welded to the connection post. In certain embodiments, the contact pads are non-planar and the connection posts are inserted into the contact pads.

The present invention provides structures and methods that enable the construction of circuit elements that are transfer printed onto a device substrate and electrically connected using connection posts. The micro-transfer printing process enables the use of smaller and less expensive high-performance components, improving the flexibility and performance of the communication device. The electrical interconnection process is simple and inexpensive requiring fewer process steps and substrates or layers than known alternative methods.

In one aspect, the disclosed technology includes an electromagnetic communication device, including: a device substrate; an antenna formed on or in the device substrate; and a circuit element having an electrical circuit and one or more electrically conductive connection posts protruding from a surface of the circuit element, each of the connection posts electrically connected to the electrical circuit and at least one connection post electrically connected to the antenna.

In certain embodiments, the antenna is a cured ink, a metal foil, or is laminated to the device substrate.

In certain embodiments, the antenna has a surface and the connection post is deformed, is in contact with the antenna surface, is embedded in the antenna surface, or pierces the antenna surface.

In certain embodiments, the communication device including a wire on or in the device substrate, the wire electrically connected to the antenna, and wherein the connection post is in contact with, is embedded in, or pierces the wire.

In certain embodiments, the electrical circuit includes one or more of an electrical conductor, a capacitor, a resistor, a transistor, a diode, and an integrated circuit.

In certain embodiments, the integrated circuit is a chiplet having at least one of: at least one of a length and width less than or equal to 200 microns, 100 microns, 50 microns, 20 microns, 10 microns, or 5 microns, and a thickness less than or equal to 20 microns, 10 microns, 5 microns, 2 microns, or 1 micron.

In certain embodiments, the circuit element is a micro-transfer printed element and includes a fractured tether.

In certain embodiments, the communication device is a radio frequency identification device (RFID) or a near-field communication (NFC) device.

In certain embodiments, the device substrate includes markings, is a label, or is an adhesive label.

In certain embodiments, the device substrate is flexible and the connection post is rigidly affixed to the antenna or device substrate.

In certain embodiments, the device substrate is flexible and the circuit element is adhered to the antenna or device substrate.

In certain embodiments, the antenna is a multi-layer spiral loop antenna having a first end and a second end and an even number of layers, and wherein both of the first and second ends of the antenna are closer to the center of the spiral than the edge of the spiral.

In certain embodiments, the antenna is a loop antenna with first and second ends, the circuit element has at least first and second connection posts, and the first connection post is electrically connected to the first end of the antenna and the second connection post is electrically connected to the second end of the antenna.

In one aspect, the disclosed technology includes a method of making an electromagnetic communication device, including: providing a device substrate having an antenna formed on or in the device substrate; providing a circuit element having an electrical circuit and one or more electrically conductive connection posts protruding from a surface of the circuit element, each of the connection posts electrically connected to the electrical circuit; and electrically connecting at least one of the one or more connection posts to the antenna.

In certain embodiments, the method includes providing a source wafer including one or more micro-transfer printable chiplets and micro-transfer printing the one or more micro-transfer printable chiplets from the source wafer onto the device substrate, wherein the circuit element comprises at least one of the one or more chiplets.

In certain embodiments, the method includes providing one or more micro-transfer printable circuit elements; and micro-transfer printing the one or more micro-transfer printable circuit elements onto the device substrate so that at least one connection post of at least one of the one or more circuit elements: is embedded in the antenna, pierces the surface of the antenna, or is deformed and in contact with the antenna.

In certain embodiments, the method includes adhering the circuit element to the device substrate with an adhesive.

In certain embodiments, the method includes heating at least a portion of the device substrate.

In certain embodiments, the method includes providing a source wafer including one or more micro-transfer printable chiplets and an intermediate substrate, micro-transfer printing the one or more micro-transfer printable chiplets from the source wafer to an intermediate substrate to form the circuit element, and micro-transfer printing the circuit element to the device substrate.

In certain embodiments, the method includes forming connection posts on the intermediate substrate; and electrically connecting the one or more connection posts to the one or more chiplets.

In certain embodiments, the intermediate substrate includes a plurality of circuit elements and the intermediate substrate has an area that is equal to or larger than the area of the device substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1A is a perspective of an exemplary embodiment of the present invention;

FIG. 1B is a cross section of FIG. 1A taken across cross section line A in an exemplary embodiment of the present invention;

FIG. 4 and FIG. 5 are cross section of exemplary embodiments of the present invention including an adhesive;

FIG. 6 is a cross section of some embodiments of the present invention having a multi-layer antenna;

Figure 2C:
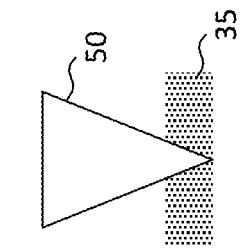
FIG. 2A, FIG. 2B, and FIG. 2C are cross sections of a connection post and contact pad according to various embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to the perspective of FIG. 1A and the corresponding cross section of FIG. 1B along cross section line A of FIG. 1A, in some embodiments of the present invention an electromagnetic communication device 10 includes a device substrate 20 and an antenna 40 formed on or in the device substrate 20. A circuit element 30 has an electrical circuit 32 and one or more electrically conductive connection posts 50 protruding from the circuit element 30 or from a surface of the circuit element 30. Each of the connection posts 50 is electrically connected to the electrical circuit 32, for example with a wire 34, and at least one connection post 50 is electrically connected to the antenna 40. The circuit element 30 can be a micro-transfer printed circuit element 30 that includes a fractured tether 36. In some embodiments, the communication device is a radio frequency identification device (RFID) or a near-field communication (NFC) device.

The device substrate 20 can be any rigid or flexible substrate and, for example, can be glass, plastic, polymer, or foil. In one embodiment, the device substrate 20 is flexible paper or flexible plastic, for example a label or security document such as government-issued identification documents, licenses, or banknotes, or commercial documents such as certificates, bonds, or the like. The device substrate 20 can include markings, can be a label, or can be an adhesive label.

The antenna 40 can be any patterned electrically conductive structure, for example metal lines made by photolithography, cured ink formed in micro-contact embossed structures, electroplating or electroless deposition on a printed layer, or layer lamination for example of a patterned metal foil. Useful conductive metals include, but are not limited to, silver, copper, and aluminum. Transparent conductive oxides such as indium tin oxide or aluminum zinc oxide can be patterned on the device substrate 20 to form a transparent antenna 40. The antenna 40 can be a spiral antenna, as shown, or can have other shapes.

The circuit element 30 can be or can incorporate an integrated circuit or discrete components and the electrical circuit 32 can include active and passive electronic components and conductors. The circuit element 30 can be or include a micro-transfer printed chiplet, for example including a fractured tether 36, and can include a circuit substrate separate and independent from the device substrate 20, for example a rigid glass substrate or a semiconductor substrate. The circuit substrate can be an integrated circuit substrate or a substrate on which a variety of integrated or discrete components, such as an electrical conductor, a capacitor, a resistor, a transistor, a diode, or an integrated circuit, are disposed and electrically connected, for example using photolithographic patterning methods. In some embodiments, the integrated circuit is a chiplet having a length or width less than or equal to 200 microns, 100 microns, 50 microns, 20 microns, 10 microns, and 5 microns, or a thickness less than or equal to 20 microns, 10 microns, 5 microns, 2 microns, and 1 micron.

Figure 2B:
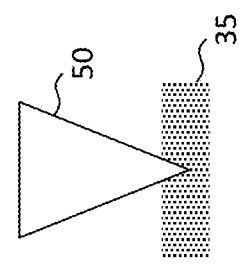
Figure 2A:
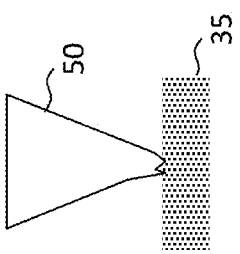
Figure 3:
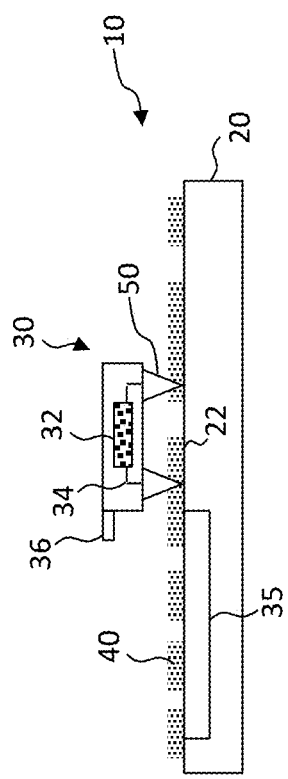
FIG. 3 is a cross section of an exemplary embodiment of the present invention including a loop antenna.

The connection posts 50 can be metal posts or metal-coated post structures electrically connected to and formed by lithographic processes. In some embodiments, the antenna 40 has a surface in contact with the connection post 50. Referring to FIGS. 2A-2C, the connection post 50 can be deformed (FIG. 2A) or can be embedded in (FIG. 2B) or can pierce (FIG. 2C) the antenna surface or a wire 35 electrically connected to the antenna 40. In some embodiments, the electrical circuit 32 of the circuit element 30 includes one or more wires 34 or other conductors and the connection post 50 is in contact with a wire 34. FIG. 3 illustrates a circuit element 30 with connection posts 50, one of which is in contact with the antenna 40 at a first end of the antenna 40 and the other of which is in contact with contact pad 22 and electrically connected to a wire 35 that is electrically connected to the antenna 40 at a second, opposite end of the antenna 40 to form an electrically connected loop antenna 40. As used herein, and for exposition clarity, wires 34 are found in the circuit element 30 and wires 35 on the device substrate 20. The connection post 50 is electrically connected to the antenna 40 on the device substrate 20 with a contact pad 22. The contact pad 22 can be a special conductive portion of the device substrate 20, a wire 35, or a portion of the antenna 40. For clarity and simplicity, any one or more of the wire 35 or portion of the wire 35, antenna 40, or a separate contact pad 22 are referred to as a contact pad 22 and the term contact pad 22 refers to any or all of them where it is electrically connected to the connection post 50.

In some embodiments of the present invention, the device substrate 20 is flexible, for example made of thin paper or plastic. In such some embodiments, the circuit element 30 can be more rigid than the device substrate 20 and, when flexed, the electrical connection between the contact pad 22 and a connection post 50 can be stressed. To reduce the stress, the connection post 50 can be rigidly affixed to the contact pad 22, antenna 40, or device substrate 20. By rigid in this context is meant that the rigidly affixed portion is more rigid than the portion that is not rigidly affixed so that the portion that is not rigidly affixed preferentially flexes when the entire device substrate 20 is flexed. Referring to FIG. 4, an adhesive such as a cured resin 52 is applied over the entire circuit element 30 and the contact pad 22. In an alternative embodiment, referring to FIG. 5, the circuit element 30 is adhered to the contact pad 22, antenna 40, or device substrate 20, for example with a layer of adhesive provided over the contact pad 22, the antenna 40, or device substrate 20.

In the embodiments of FIGS. 4 and 5, the device substrate 20 is, for example, a printed label that is adhered to an object 90. Alternatively, the device substrate 20 is packaging material or a package or container, such as a box. In some embodiments, the device substrate 20 is a portion of an article, for example a banknote or a page in a passport booklet.

Referring to FIG. 6, in some embodiments of the present invention, the antenna 40 is a multi-layer spiral loop antenna 40 having first and second ends and an even number of antenna layers 42. The antenna layers 42 are separated by or embedded in an antenna dielectric layer 62 to prevent electrical shorts between the antenna layers 42. Both of the first and second ends of the antenna 40 are closer to the center of the spiral than the edge of the spiral. For example, the antenna layer 42 in which the circuit element 30 is disposed on the device substrate 20, which is disposed on an object 90, can extend from a first, central end of the spiral to which the circuit element 30 is connected, to an outside edge of the spiral. At the outside edge of the spiral, the antenna 40 is electrically connected with an antenna layer connection 44 through a via in the antenna dielectric layer 62 to the outside edge of a second antenna layer 40 formed in a spiral. The spiral in the second antenna layer 42 extends back to the center of the spiral and is connected, through a via in the antenna dielectric layers 62 and another antenna layer connection 44, through contact pads 22 and wires 35 to the circuit element 30. The circuit element 30 can be connected to contact pads 22 by connection posts 50 (not shown), which are in electrical contact with the antenna 40.

Figure 7:
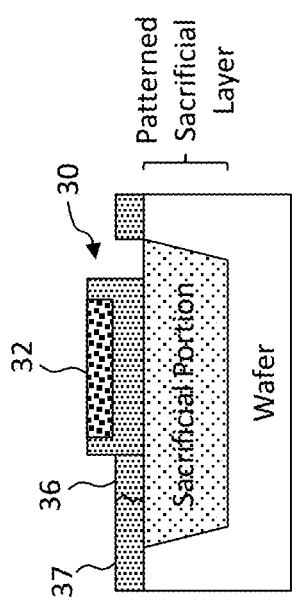
FIG. 7 is a cross section of a source wafer according to an exemplary embodiment of the present invention.

In embodiments of the present invention, the circuit element 30 can be a micro-transfer printable element, can include one or more micro-transfer printable chiplets, or the electrical circuit 32 can include or be one or more micro-transfer printable elements. Referring in general to micro-transfer printable structures and in particular to FIG. 7, a wafer comprising a wafer material includes a patterned sacrificial layer having sacrificial portions separating anchor 37 portions of the wafer. A device, such as an integrated circuit, a chiplet, a portion of the electrical circuit 32, the electrical circuit 32, or a circuit element 30 can be disposed or formed entirely over the sacrificial portion and is physically connected to an anchor 37 with a tether 36. When the sacrificial portion is etched away, the device is released from the wafer except for the tether 36 connecting the device to an anchor 37. A micro-transfer printing stamp can press against the device to fracture the tether 36 and adhere the device to the transfer stamp. The transfer stamp and device are then transported to a destination substrate, the device is contacted and adhered to the destination substrate with the transfer stamp, and the transfer stamp is removed.

Figure 8:
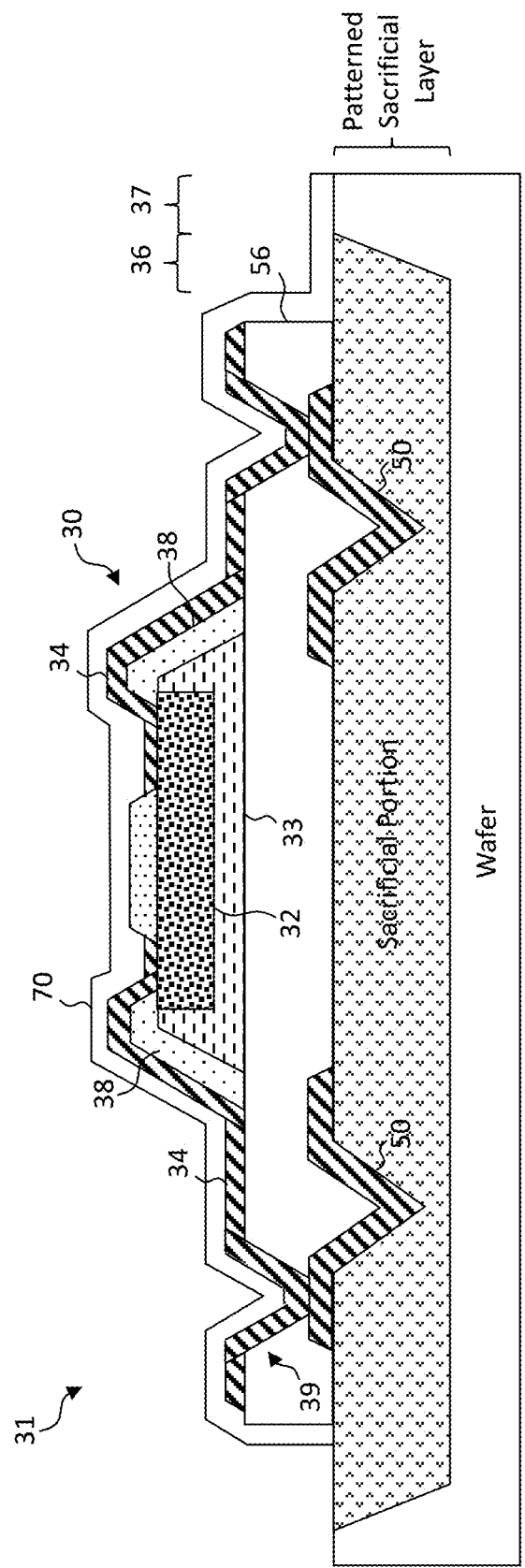
FIG. 8 is a cross section of an intermediate wafer according to an exemplary embodiment of the present invention.
Figure 9:
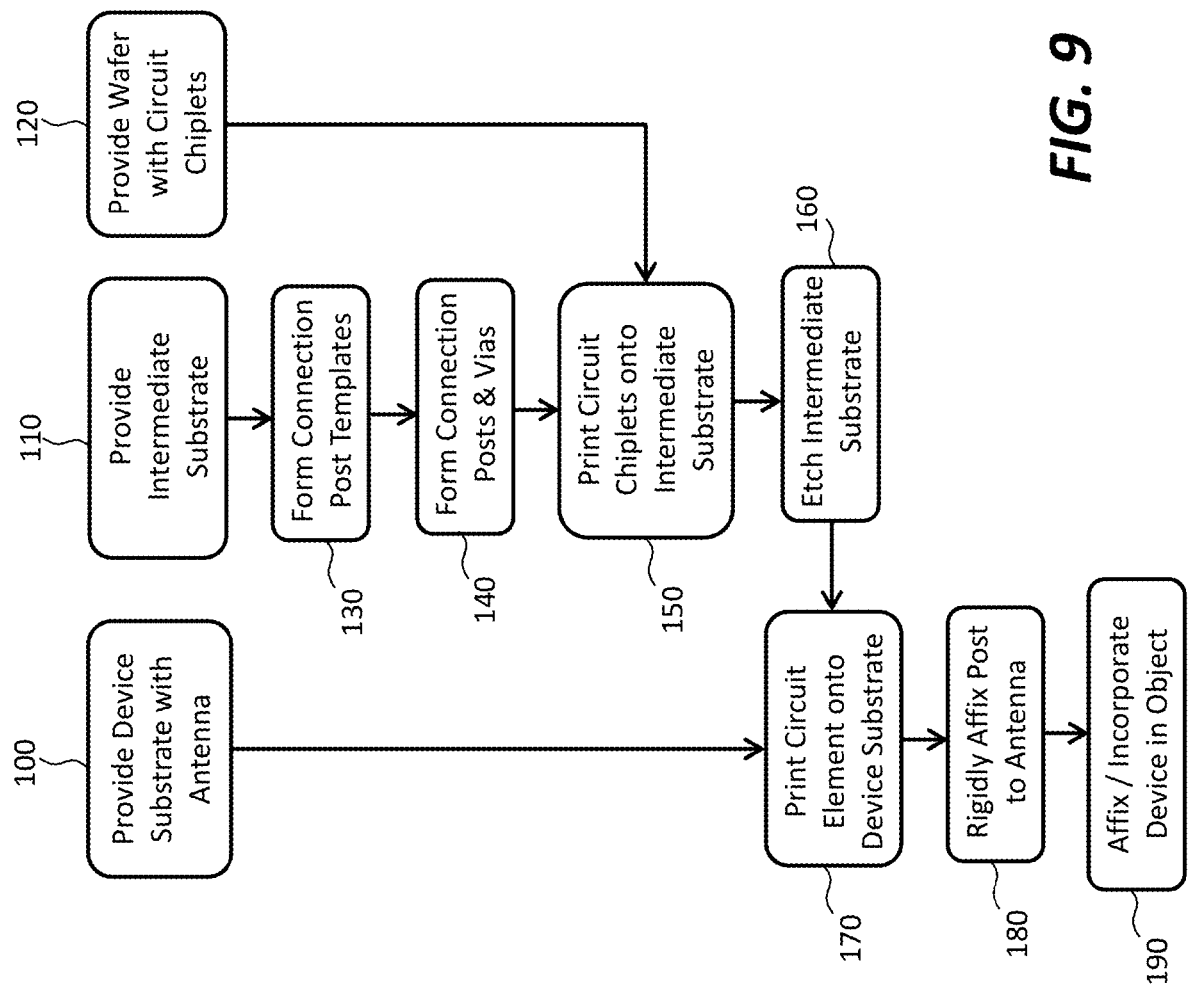
FIG. 9 is a flow chart illustrating exemplary methods of the present invention.

Referring to the cross-section structure of FIG. 8, the flow chart of FIG. 9, and with reference to FIGS. 1A and 1B, a method and structure of the present invention includes providing in step 100 a device substrate 20 having an antenna 40 formed on or in the device substrate 20, for example by laminating a patterned metal foil, coating and curing a liquid ink in trenches formed with micro-contact printing or embossing, or through conventional photolithographic processing of the device substrate 20.

In step 110, an intermediate substrate source wafer 31 is provided with a patterned sacrificial layer forming sacrificial portions separated by anchors 37. The intermediate substrate can be a semiconductor wafer such as anisotropically etchable silicon (e.g., (1 0 0) oriented silicon) or a glass wafer with a buried oxide layer forming or defining a patterned sacrificial layer. A part of each of the sacrificial portions is etched in step 130 to make a connection post form, for example a pyramidal indentation in each sacrificial portion, using photolithographic etching techniques. A metal layer is patterned over the etched parts to form the connection posts 50, a dielectric substrate 56 is coated over the wafer for example by spin coating or laminating, and vias 39 formed in the dielectric substrate 56 to expose a part of the connection post 50 in step 140.

In step 120, a chiplet source wafer, for example made of a semiconductor 33 such as silicon or a compound semiconductor is provided and processed to form chiplets, for example using micro-transfer printing structures as described. A chiplet is micro-transfer printed from the chiplet source wafer onto the dielectric substrate 56 on or over each sacrificial portion of the intermediate substrate source wafer 31 in step 150. In some embodiments, one or more chiplets are disposed, for example by micro-transfer printing, onto the dielectric substrate 56 on or over each sacrificial portion. If a plurality of chiplets is disposed over each sacrificial portion, they can be a heterogeneous group of components, for example made in different technologies using different materials. A dielectric layer 38 can be patterned over the micro-transfer printed structure to prevent unwanted electrical contact with the chiplets. A pattern of wires 34 are then formed, for example using conventional photolithographic methods and material, that interconnect the chiplets and the connection post 50 to form the electrical circuit 32. Optionally, an encapsulation layer 70 is provided over the electrical circuit 32 and wires 34 to form the circuit element 30. The sacrificial portions of the intermediate substrate are then etched in step 160 to release the circuit elements 30 and form the tether 36 connecting the circuit element 30 to the anchors 37. The circuit element 30 is micro-transfer printed onto the device substrate 20 in step 170. If the circuit element 30 is optionally rigidly affixed to the device substrate 20, an adhesive such as a curable adhesive (FIG. 4) is optionally provided in step 180 and cured. Alternatively, the device substrate 20 can be provided with an adhesive layer (as shown in FIG. 5). If the device substrate 20 is the object desired, the process is completed, for example if the device substrate 20 is a banknote. Alternatively, the device substrate 20 can be incorporated into an object 90, for example if the device substrate 20 is a passport page or a ribbon incorporated into another object such as a banknote. In some embodiments, the device substrate 20 is affixed to the object 90 in step 190, for example the device substrate 20 is a label and the object 90 is a bottle or other container.

In certain embodiments, the present invention provides advantages over electromagnetic communication devices of the prior art. Because they are micro-transfer printed, the circuit elements 30 can be very small unpackaged chiplets with no external ceramic or plastic packaging conventionally used for integrated circuits. Because they are small, the circuit elements 30 enhance the flexibility of the device substrate 20 by reducing the area attached to more-rigid components. Moreover, unpackaged chiplets, for example semiconductor substrates are more flexible than packaged devices, further enhancing the flexibility of the structure. By using connection posts 50 to form electrical connections between the electrical circuit 32 and the device substrate 20, for example electrical connections to contact pads 22 for wires 34 or to portions of antennas 40, the size of the electrical connection is reduced, enhancing flexibility and electrical connection robustness. Furthermore, fewer manufacturing steps are required to micro-transfer print and electrically connect a chiplet with a connection post 50 since the step of micro-transfer printing also forms the electrical connection, reducing costs and enhancing reliability. Moreover, providing a device substrate 20 that can be very flexible, includes the antenna 40, and can serve as the substrate of an object can also reduce the number of elements in the final product since an additional substrate for the antenna 40 and circuit element 30 can no longer be necessary.

In operation, the antenna 40 of the electromagnetic communication device 10 receives an electromagnetic signal sent, for example, by an RFID or NFC reader at a designed frequency to make an electrical signal in the antenna 40. The electrical signal is electrically communicated through the contact pads 22, the connection posts 50, and the wires 34 to the electrical circuit 32. The electrical circuit 32 responds as it is designed. In one embodiment, the electrical circuit 32 includes one or more LEDs and emits light. In some embodiments, the electrical circuit 32 responds by generating a signal that is transferred through the wires 34, the connection posts 50, the contact pads 22, and the antenna 40 to generate an electromagnetic signal that can be, for example, received by an RFID or NFC reader.

Figure 10:
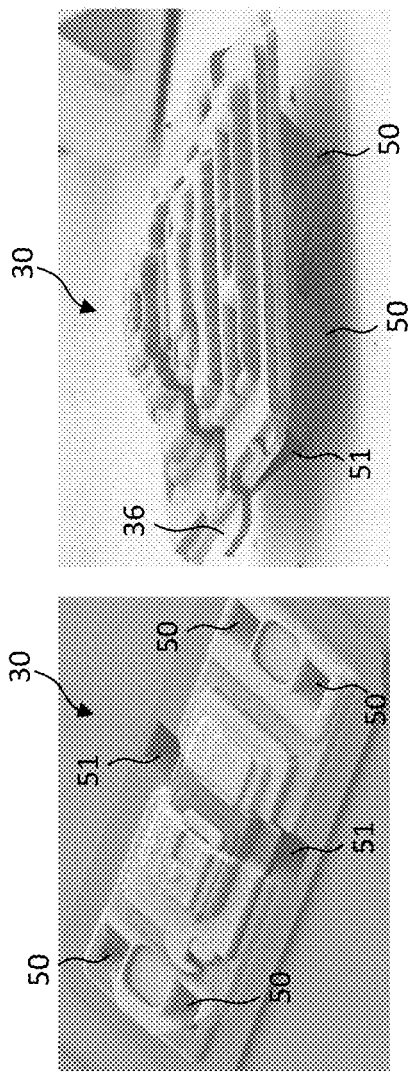
FIG. 10 is a micrograph of a circuit element according to an exemplary embodiment of the present invention.

FIG. 10 shows two micrographs of a micro-transfer printed circuit element 30 constructed using the materials and methods described herein. The electrical circuit 32 is formed in a small integrated circuit (chiplet) using integrated circuit manufacturing processes. The circuit element 30 has 6 connection posts 50, two for each device substrate 20 contact pad 22 located at either end of the circuit element 30. The two center offset posts 51 are not electrically connected and serve to improve adhesion to the optional layer of adhesive 54 by enhancing wicking of the adhesive 54 when the adhesive 54 is not solid. The offset posts 51 can have the same height as the connection posts 50, or can be shorter. The circuit element 30 of FIG. 10 has been micro-transfer printed successfully to a device substrate 20 and successfully tested when provided with electrical power.

FIG. 5 also illustrates the use of an adhesive 54 that adheres the circuit element 30 to the device substrate 20. The adhesive 54 can be deposited in drops, for example, with an inkjet deposition device or as a layer over the device substrate 20, and can underfill the volume between the circuit element 30 and the device substrate 20. In some embodiments, the adhesive 54 is provided on the connection posts 50 or is a solder that reflows when exposed to heat to provide electrical conduction and adhesion.

The electrically conducting wires 34 can be a metal, such as aluminum, silver, gold, tantalum, tungsten, titanium, or tin, or a metal alloy and can be patterned to form electrodes or electrical traces that conduct electricity from the device substrate 20 to the electrical circuit 32. The wires 34 in the circuit element 30 can be deposited and patterned using photolithographic methods known in the integrated circuit arts, for example, using sputtering or evaporation with patterned etching. The wires 35, antenna 40, or contact pads 22 in or on the device substrate 20 can be formed using lower resolution processes, such as printed circuit board methods, screen printing, or lamination, at reduced cost or, alternatively, can be formed using methods similar to those used in the circuit element 30. Patterned dielectric structures 38 can be formed before the wires 34 are deposited and patterned to electrically insulate portions of the electrical circuit 32 and control the flow of electrical current through the electrical circuit 32. The patterned dielectric structures 38 can be, for example, silicon dioxide or other insulators that can be patterned using photolithographic methods.

The wires 34 can provide rigidity and mechanical strength to the circuit element 30 so that the circuit element 30 can be micro-transfer printed and the connection posts 50 pressed into an electrical contact pad 22 on the device substrate 20 to form a robust electrical connection without harming the circuit element 30 or the wires 34 in the electrical circuit 32 or causing them to function improperly. In further embodiments, an encapsulation layer 70 provides environmental protection and additional mechanical strength to the circuit element 30 and can also form the tether 36 or a portion of the tether 37. The encapsulation layer 70 can be formed using dielectric materials (for example, silicon nitride or silicon dioxide) that are coated over the circuit element 30 or electrical circuit 32 and then patterned using photolithographic processes, such as using a photosensitive layer (e.g., photoresist) to form a patterned mask after light exposure and then etching the photosensitive layer and one or more layers beneath the photosensitive layer. Similar methods can be used to pattern the dielectric structure 38 and wires 34.

The electrical circuit 32 can be an active circuit, for example including one or more active elements such as electronic transistors, diodes, light-emitting diodes, or photodiodes that produce an electrical current in response to ambient light, a passive circuit including electrical conductors (wires 34), resistors, or capacitors, or the electrical circuit 32 can include both active and passive elements. The circuit element 30 can be or include a semiconductor device having one or more semiconductor layers and can be an unpackaged die. In yet some embodiments, the circuit element 30 has a plurality of active or passive elements, such as multiple semiconductor devices with separate substrates, each with one or more active elements or passive elements, or both. The multiple semiconductor devices can include a variety of different materials process using different processes.

The circuit elements 30 and electrical circuit 32 made by methods of the present invention can include or be a variety of chiplets having semiconductor structures, including a diode, a light-emitting diode (LED), a transistor, or a laser. Chiplets are small integrated circuits and can be unpackaged dies released from a source wafer and can be micro-transfer printed. Chiplets can have at least one of a width and length from 2 to 5 µm, 5 to 10 µm, 10 to 20 µm, 20 to 50 µm, 50 to 100 µm, or 100 to 1000 µm. Chiplets can have a doped or undoped semiconductor substrate thickness of 2 to 5 µm, 5 to 10 µm, 10 to 20 µm, or 20 to 50 µm. The chiplet or active elements can include micro-light-emitting diodes with a length greater than width, for example having an aspect ratio greater than or equal to 2, 4, 8, 10, 20, or 50.

Such micro-transfer printable chiplets can be made in a semiconductor source wafer (e.g., a silicon or GaN wafer) having a process side and a back side used to handle and transport the wafer. The chiplets are formed using lithographic processes in an active layer on or in the process side of a source wafer. An empty release layer space (corresponding to the sacrificial portion in FIG. 7) is formed beneath the micro-transfer printable chiplets with tethers 36 connecting the micro-transfer printable chiplets to the source wafer in such a way that pressure applied against the micro-transfer printable chiplets with a transfer stamp breaks the tethers 36 to release the micro-transfer printable chiplets from the source wafer. The chiplets are then micro-transfer printed to the circuit element 30. Lithographic processes in the integrated circuit art for forming micro-transfer printable chiplets in a source wafer, for example transistors, LEDS, wires, and capacitors, can be used.

Methods of forming such structures are described, for example, in the paper *AMOLED Displays using Transfer-Printed Integrated Circuits* and U.S. Pat. No. 8,889,485, referenced above. Micro-transfer printing techniques suitable for use in embodiments of the present disclosure are described in U.S. Pat. Nos. 8,722,458, 7,622,367 and 8,506,867, the disclosure of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, the disclosure of which is hereby incorporated by reference in its entirety.

According to various embodiments of the present invention, the circuit element source wafer can be provided with the circuit elements 30, release layer (sacrificial layer), tethers 36, and connection posts 50 already formed, or they can be constructed as part of the process of the present invention. Similarly, any source wafers having micro-transfer printable chiplets used in the electrical circuit 32 thereon can be constructed or transfer printed as part of the process of the present invention.

Connection posts 50 are electrical connections formed on a side of the circuit element 30 that extend generally perpendicular to a surface of the circuit element 30. Such connection posts 50 can be formed from metals such as aluminum, titanium, tungsten, copper, silver, gold, or other conductive metals. In some embodiments, the connection posts 50 are made of one or more high elastic modulus metals, such as tungsten. As used herein, a high elastic modulus is an elastic modulus sufficient to maintain the function and structure of the connection posts 50 when pressed into a device substrate 20 contact pads 22.

The electrically conductive connection posts 50 that protrude from the circuit element 30 can be, but are not necessarily, the same material and can be, but are not necessarily, made in a common step with the wires 34 in the electrical circuit 32. The electrically conductive connection posts 50 can be a spike with a sharp point. In one embodiment, the connection posts 50 are a portion of the wires 34 of the electrical circuit 32. The connection posts 50 protrude and extend beyond a side of the electrical circuit 32, for example beyond an integrated circuit or chiplet surface and in a direction orthogonal to the surface, so that if the circuit element 30 is pressed against a destination surface, such as a surface of the device substrate 20, the connection posts 50 will contact the destination surface preventing the electrical circuit 32 or other elements of the electrical circuit 32 from contacting the destination surface. If the micro-transfer printable circuit element 30 is forcefully pressed against the surface of the device substrate 20, the connection posts 50 can be in contact with, embedded in, or pierce the surface. For example, if the surface includes electrical contact pads 22 for wires 35 or the antenna 40 on the device substrate 20 or both the electrical contact pads 22 and the antenna 40, the connection posts 50 can form a mechanically robust electrical connection between the electrical circuit 32 and the device substrate 20 electrical contact pads 22, the antenna 40, or both the electrical contact pads 22 and the antenna 40. Generally, it is contemplated that methods for and configurations of connecting connection posts 50 to electrical contact pads 22 can be used to connect connection posts 50 to portions of antennas 40.

The connection posts 50 (including the offset posts 51) can have a variety of aspect ratios and typically have a peak area smaller than a base area. The connection posts 50 can have a sharp point for embedding in or piercing device substrate 20 contact pads 22. The connection posts 50 can include a post material coated with an electrically conductive material different from the post material. The post material can be an electrically conductive metal or a doped or undoped semiconductor or an electrically insulating polymer, for example a resin, cured resin, or epoxy and can have any of a variety of hardness or elastic modulus values. In some embodiments, the post material is softer than the conductive material so that the post material can crumple when the connection post 50 is under mechanical pressure. Alternatively, the conductive material is softer than the post material so that it deforms before the post material when under mechanical pressure. By deform, it is meant that the connection posts 50 or the contact pads 22 or conductive material change shape as a consequence of the transfer printing. The connection post 50 or post material can be a semiconductor material, such as silicon or GaN, formed by etching material from around the connection post 50. Coatings, such as the conductive material can be evaporated or sputtered over the post material structure and then patternwise etched to form the connection post 50. The conductive material can be a solder or other metal or metal alloy that flows under a relatively low temperature, for example less than 120 degrees C. In particular, the conductive material can have a melting point less than the melting point of the post material.

In certain embodiments, the contact pads 22 comprise a material that is softer than that of the connection post 50. In certain embodiments, the connection posts 50 comprise a material that is softer than that of the contact pads 22. In certain embodiments, a conductive material other than a material of the device substrate 20 contact pads 22 or the connection post 50 adheres or electrically connects the contact pads 22 to the connection post 50. In certain embodiments, the contact pads 22 have a first conductive layer and a second conductive layer over the first conductive layer, and the second conductive layer has a lower melting temperature than the first conductive layer. In embodiments, the contact pads 22 are coated with a non-conductive layer or the contact pads 22 are formed on a compliant non-conductive layer. In certain embodiments, the second conductive layer is a solder. In certain embodiments, the contact pads 22 are welded to the connection post 50. In certain embodiments, the contact pads 22 are non-planar and the connection posts 50 are inserted into the contact pads 22.

The device substrate 20 contact pads 22 can be made of a relatively soft metal, such as tin, solder, or tin-based solder, to assist in forming good electrical contact with the connection posts 50 and adhesion with the circuit elements 30. As used herein, a soft metal may refer to a metal into which a connection post 50 can be pressed to form an electrical connection between the connection post 50 and the contact pads 22. In this arrangement, the contact pads 22 can plastically deform and flow under mechanical pressure to provide a good electrical connection between the connection post 50 and the contact pads 22.

If an optional layer of adhesive 54 is formed on the device substrate 20, the connection posts 50 can be driven through the adhesive layer 54 to form an electrical connection with the contact pads 22 beneath the adhesive layer 54. The adhesive layer 54 can be cured to more firmly adhere the circuit element 30 to the device substrate 20 and maintain a robust electrical connection between the connection posts 50 and contact pads 22 in the presence of mechanical stress. The adhesive layer 54 can undergo some shrinkage during the curing process that can further strengthen the electrical connectivity and adhesion between the connection post 50 and the contact pads 22.

In certain embodiments of the present invention, the connection posts 50 of the circuit elements 30 are in contact with, are embedded in, or pierce the contact pads 22 of the device substrate 20. In other or additional embodiments, either or both of one or more of the connection posts 50 and the contact pads 22 are deformed or crumpled into a non-planar shape or are deformed so that the surfaces of the connection posts 50 and the contact pads 22 change shape on contact with each other. The connection posts 50 can plastically deform and flow under mechanical pressure to provide a good electrical connection between the connection post 50 and the contact pads 22 by increasing the surface area that is in contact between the connection posts 50 and the contact pads 22. To facilitate deformation, in some embodiments the connection posts 50 have a composition softer than that of the contact pads 22 or the contact pads 22 have a composition softer than the connection posts 50.

In some embodiments, the contact pads 22 are coated with an optional polymer layer that can extend over the device substrate 20. The connection posts 50 of the circuit elements 30 are driven through the polymer layer to make electrical contact with the contact pads 22. The polymer layer can protect the contact pads 22 and serves to embed the connection posts 50 in the contact pads 22 by adhering to the connection posts 50. Alternatively, a compliant polymer layer is formed beneath the contact pads 22 to facilitate the mechanical contact and deformation made when the connection posts 50 are embedded in the contact pads 22. For example, a metal or metal alloy containing as gold, tin, silver, or aluminum, can be formed over a polymer layer or a polymer layer coated over a metal or metal alloy containing gold, tin, silver, or aluminum. The compliant polymer layer can also serve to adhere the connection posts 50 to the contact pads 22.

In some embodiments, the micro-transfer printable circuit elements 30 include small integrated circuits or assemblies of such small integrated circuits formed in or disposed on a semiconductor wafer, for example gallium arsenide or silicon, which can have a crystalline structure. Processing technologies for these materials typically employ high heat and reactive chemicals. However, by employing transfer technologies that do not stress the circuit elements 30 or device substrate materials, more benign environmental conditions can be used compared to thin-film manufacturing processes. Thus, in certain embodiments, devices according to the present invention has an advantage in that flexible substrates, such as polymeric substrates, that are intolerant of extreme processing conditions (e.g. heat, chemical, or mechanical processes) can be employed as device substrates 20. Furthermore, it has been demonstrated that crystalline semiconductor substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the micro-transfer printable circuit elements 30 can be formed in a microcrystalline, polycrystalline, or amorphous semiconductor layer.

Any source wafers, micro-transfer printable circuit elements 30, micro-transfer printing stamps, and device substrates 20 can be made separately and at different times or in different temporal orders or locations and can be provided in various process states.

Certain embodiments of the present invention provide advantages over other printing methods described in the prior art. By employing connection posts 50 on circuit elements 30 and a micro-transfer printing method that provides circuit elements 30 on a device substrate 20 and connection posts 50 adjacent to the device substrate 20, a low-cost method for printing circuit elements 30 in large quantities over a device substrate 20 is provided. Furthermore, additional process steps for electrically connecting the circuit elements 30 to the device substrate 20 are obviated.

In comparison to thin-film manufacturing methods, certain embodiments of the present invention using densely populated source wafers and transferring printable circuit elements 30 to a device substrate 20 that requires only a sparse array of circuit elements 30 located thereon does not waste or require active layer material on a device substrate 20. Certain embodiments of the present invention can also be used in transferring printable circuit elements 30 made with crystalline semiconductor materials that have higher performance than thin-film active components. Furthermore, the flatness, smoothness, chemical stability, and heat stability requirements for a device substrate 20 used in embodiments of the present invention may be reduced because the adhesion and transfer process is not substantially limited by the material properties of the device substrate 20. Manufacturing and material costs may be reduced because of high utilization rates of more expensive materials (e.g., the source substrate) and reduced material and processing requirements for the device substrate 20.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross-section line
10 electromagnetic communication device
20 device substrate
22 contact pad
30 circuit element
31 intermediate substrate source wafer
32 electrical circuit
33 semiconductor
34 wire
35 wire
36 tether/fractured tether
37 anchor
38 dielectric/dielectric layer/dielectric structure
39 via
40 antenna
42 antenna layer
44 antenna layer connection
50 connection post
51 offset posts
52 resin/curable resin
54 adhesive/adhesive layer/layer of adhesive
56 dielectric substrate
62 antenna dielectric layer
70 encapsulation layer
90 object
100 provide device substrate with antenna step
110 provide intermediate substrate step
120 provide wafer with circuit chiplets step
130 form connection post templates step
140 form connection posts and vias step
150 print circuit chiplets onto intermediate substrate step
160 etch intermediate substrate step
170 print circuit elements onto device substrate step
180 rigidly affix post to antenna step
190 affix device to object step

What is claimed:

1. An electromagnetic communication device, comprising:
    a device substrate;
    an antenna formed on or in the device substrate; and
    a circuit element comprising an electrical circuit and one or more electrically conductive connection posts protruding from a surface of the circuit element, each of the connection posts electrically connected to the electrical circuit and at least one connection post electrically connected to the antenna,
    wherein the circuit element is a chiplet having at least one of a length and a width that is less than 200 microns and comprises a fractured tether.

2. The communication device of claim 1, wherein the antenna is a cured ink, a metal foil, or is laminated to the device substrate.

3. The communication device of claim 1, wherein the antenna has a surface and at least one of the connection posts: is deformed, is in contact with the antenna surface, is embedded in the antenna surface, or pierces the antenna surface.

4. The communication device of claim 1, comprising a wire on or in the device substrate, the wire electrically connected to the antenna, and wherein the connection post is in contact with, is embedded in, or pierces the wire.

5. The communication device of claim 4, wherein the circuit element is a chiplet having at least one of:
    at least one of a length and width that is less than or equal to 100 microns, and
    a thickness less than or equal to 20 microns.

6. The communication device of claim 1, wherein the electrical circuit comprises one or more of an electrical conductor, a capacitor, a resistor, a transistor, a diode, and an integrated circuit.

7. The communication device of claim 1, wherein the communication device is a radio frequency identification device (RFID) or a near-field communication (NFC) device.

8. The communication device of claim 1, wherein the device substrate comprises markings, is a label, or is an adhesive label.

9. The communication device of claim 1, wherein the device substrate is flexible and the connection post is rigidly affixed to the antenna or device substrate.

10. The communication device of claim 1, wherein the device substrate is flexible and the circuit element is adhered to the antenna or device substrate.

11. The communication device of claim 1, wherein the antenna is a multi-layer spiral loop antenna comprising a first end and a second end and an even number of antenna spiral loop layers, and wherein both of the first and second ends of the antenna are closer to the center of the spiral than the edge of the spiral.

12. The communication device of claim 1, wherein the antenna is a loop antenna with first and second ends, the circuit element comprises at least first and second connection posts, and the first connection post is electrically connected to the first end of the antenna and the second connection post is electrically connected to the second end of the antenna.

13. A method of making an electromagnetic communication device, comprising:
    providing a device substrate comprising an antenna formed on or in the device substrate;
    providing a circuit element comprising an electrical circuit, a fractured tether, and one or more electrically conductive connection posts protruding from a surface of the circuit element, each of the connection posts electrically connected to the electrical circuit, wherein the circuit element is a chiplet having at least one of a width and a length of less than 200 microns; and
    electrically connecting at least one of the one or more connection posts to the antenna.

14. The method of claim 13, comprising:
    providing a source wafer comprising one or more microtransfer printable chiplets; and micro-transfer printing the one or more micro-transfer printable chiplets from the source wafer onto the device substrate, wherein the circuit element comprises at least one of the one or more chiplets.

15. The method of claim 13, comprising:

providing one or more micro-transfer printable circuit elements; and micro-transfer printing the one or more micro-transfer printable circuit elements onto the device substrate so that at least one connection post of at least one of the one or more circuit elements is embedded in the antenna, pierces the surface of the antenna, or is deformed and in contact with the antenna.

16. The method of claim 13, comprising adhering the circuit element to the device substrate with an adhesive.

17. The method of claim 13, comprising heating at least a portion of the device substrate.

18. The method of claim 13, comprising providing a source wafer comprising one or more micro-transfer printable chiplets and an intermediate substrate, micro-transfer printing the one or more micro-transfer printable chiplets from the source wafer to an intermediate substrate in order to form the circuit element, and micro-transfer printing the circuit element to the device substrate.

19. The method of claim 18, comprising:

forming connection posts on the intermediate substrate; and electrically connecting the one or more connection posts to the one or more chiplets.

20. The method of claim 18, wherein the intermediate substrate comprises a plurality of circuit elements and the intermediate substrate has an area that is equal to or larger than the area of the device substrate.

* * * * *